(12) United States Patent
Sato (10) Patent No.: US 8,946,813 B2
(45) Date of Patent: Feb. 3, 2015

(54) SWITCHING ELEMENT

(71) Applicant: Tomohiko Sato, Toyota (JP)

(72) Inventor: Tomohiko Sato, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 55 days.

(21) Appl. No.: 13/739,436

(22) Filed: Jan. 11, 2013

(65) Prior Publication Data

US 2013/0181283 A1 Jul. 18, 2013

(30) Foreign Application Priority Data

Jan. 12, 2012 (JP) ................. 2012-003876

(51) Int. Cl.
| | |
|---|---|
| H01L 29/66 | (2006.01) |
| H01L 29/78 | (2006.01) |
| H01L 29/40 | (2006.01) |
| H01L 29/423 | (2006.01) |
| H01L 29/739 | (2006.01) |
| H01L 29/06 | (2006.01) |

(52) U.S. Cl.
CPC .......... *H01L 29/7827* (2013.01); *H01L 29/407* (2013.01); *H01L 29/42376* (2013.01); *H01L 29/7397* (2013.01); *H01L 29/7813* (2013.01); *H01L 29/0696* (2013.01)
USPC ............ 257/330; 257/E29.262; 438/270

(58) Field of Classification Search
None
See application file for complete search history.

(56) References Cited

U.S. PATENT DOCUMENTS

2009/0114986 A1* 5/2009 Hirler et al. .................. 257/334

FOREIGN PATENT DOCUMENTS

JP 2008-227514 A 9/2008

* cited by examiner

*Primary Examiner* — Sonya D McCall Shepard
(74) *Attorney, Agent, or Firm* — Kenyon & Kenyon LLP (57) ABSTRACT

In a switching element, a first region that is exposed on an upper surface of a semiconductor substrate, a second region that is exposed on the upper surface of the substrate and extends to below the first region, and a third region that is formed below the second region, are formed on the substrate. A trench is formed in the upper surface of the substrate. A gate electrode has a first portion that extends from a depth of the first region to a depth of the third region at at least a portion in the trench formed in an area where the first region is exposed, and a second portion that is formed to a depth of the second region, and does not reach the depth of the third region, at at least a portion in the trench formed in an area where the second region is exposed.

5 Claims, 12 Drawing Sheets

FIG. 12 under the patents assignment US 8,946,813 B2

SWITCHING ELEMENT

INCORPORATION BY REFERENCE

The disclosure of Japanese Patent Application No. 2012-003876 filed on Jan. 12, 2012 including the specification, drawings and abstract is incorporated herein by reference in its entirety.

BACKGROUND OF THE INVENTION

1. Field of the Invention

The invention relates to a switching element that has a trench gate electrode.

2. Description of Related Art

Japanese Patent Application Publication No. 2008-227514 (JP 2008-227514 A) describes a switching device that has a trench gate electrode.

In a switching element that has a trench gate electrode such as that described in JP 2008-227514 A, the capacitance between the gate electrode and an upper electrode is preferably small to realize rapid switching. Therefore, the invention provides a structure of a switching element that has a trench gate electrode capable of further reducing the capacitance between the gate electrode and the upper electrode.

SUMMARY OF THE INVENTION

One aspect of the invention relates to a switching element that includes a semiconductor substrate having a first region of a first conduction type that is exposed on an upper surface of the semiconductor substrate, a second region of a second conduction type that is exposed on the upper surface of the semiconductor substrate and extends to below the first region, and a third region of the first conduction type that is formed below the second region and is separated from the first region by the second region; an upper electrode that is formed on the upper surface of the semiconductor substrate and is electrically connected to the first region and the second region; a trench that is formed in the upper surface of the semiconductor substrate and is formed extending between a region where the first region is exposed and a region where the second region is exposed; and a gate electrode that includes a first portion that is formed in the trench, and extends from a depth of the first region to a depth of the third region at at least a portion in the trench formed in an area where the first region is exposed when the upper surface of the semiconductor substrate is viewed from above, and a second portion that is formed to a depth of the second region, and does not reach the depth of the third region, at at least a portion in the trench formed in an area where the second region is exposed when the upper surface of the semiconductor substrate is viewed from above, the gate electrode being insulated from the semiconductor substrate by an insulating film.

According to this aspect, the capacitance between the gate electrode and the upper electrode is able to be reduced.

The switching element having a trench gate electrode described above includes various switching elements such as IGBTs and FETs.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

First, characteristics of the example embodiments described below will be listed. Each of the characteristics listed here is effective in its own right.

A gate electrode includes a first portion that is formed from a depth of a first region to a depth of a third region at at least a portion in a trench formed in an area where the first region is exposed when an upper surface of a semiconductor substrate is viewed from above, and a second portion that is formed within a depth range of a second region, and does not reach the depth of the third region, at at least a portion in a trench formed in an area where the second region is exposed when the upper surface of the semiconductor substrate is viewed from above. As a result, the capacitance is able to be reduced.

A shield electrode that is insulated from the gate electrode and the semiconductor substrate by an insulating film is formed below the first portion. Providing the shield electrode in this way enables the capacitance between the gate electrode and the third region to be reduced. The shield electrode that is insulated from the semiconductor substrate refers to a shield electrode that is not directly electrically connected to the semiconductor substrate. The shield electrode may also be electrically connected to the semiconductor substrate via another member (such as an upper electrode, for example).

The shield electrode is formed to below the second portion. This kind of shield electrode enables the capacitance between the gate electrode and the third region to be further reduced.

The shield electrode below the second portion extends from the depth of the second region to the depth of the third region. According to this kind of structure, the trench of the first portion and the trench of the second portion both reach to the depth of the third region, so the depths of the trenches are somewhat uniform. Therefore, disturbance in the electrical field distribution within a semiconductor layer can be inhibited.

The shield electrode is electrically connected to the upper electrode. This kind of structure enables the capacitance between the gate electrode and the third region to be further reduced.

Figure 1:
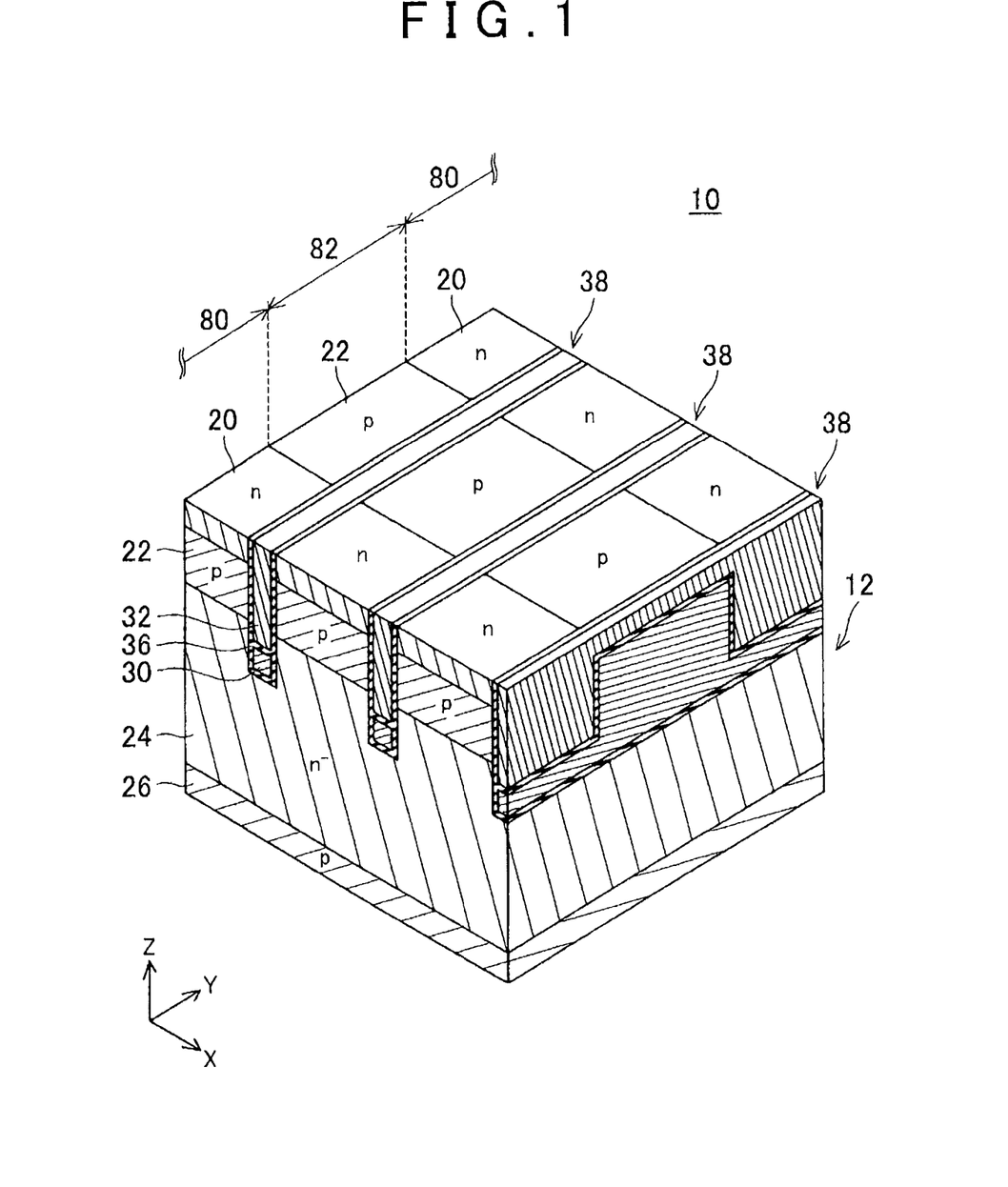
FIG. 1 is a partial perspective view of an upper surface and a cross section of an IGBT according to a first example embodiment of the invention.

FIGS. 1 to 6 are views of an IGBT 10 according to a first example embodiment of the invention. In FIG. 1, an emitter electrode 60, an interlayer insulating film 62, and a collector electrode 64 that are shown in FIGS. 2 to 6 are omitted in consideration of viewability of the drawing. As shown in the drawing, the IGBT 10 includes a semiconductor substrate 12. Hereinafter, a thickness direction of the semiconductor substrate 12 will be referred to as direction Z (Z-direction), one direction along an upper surface of the semiconductor substrate 12 (i.e., one direction perpendicular to the Z-direction) will be referred to as direction X (X-direction), and a direction that is perpendicular to the X-direction and the Z-direction will be referred to as direction Y (Y-direction).

Figure 4:
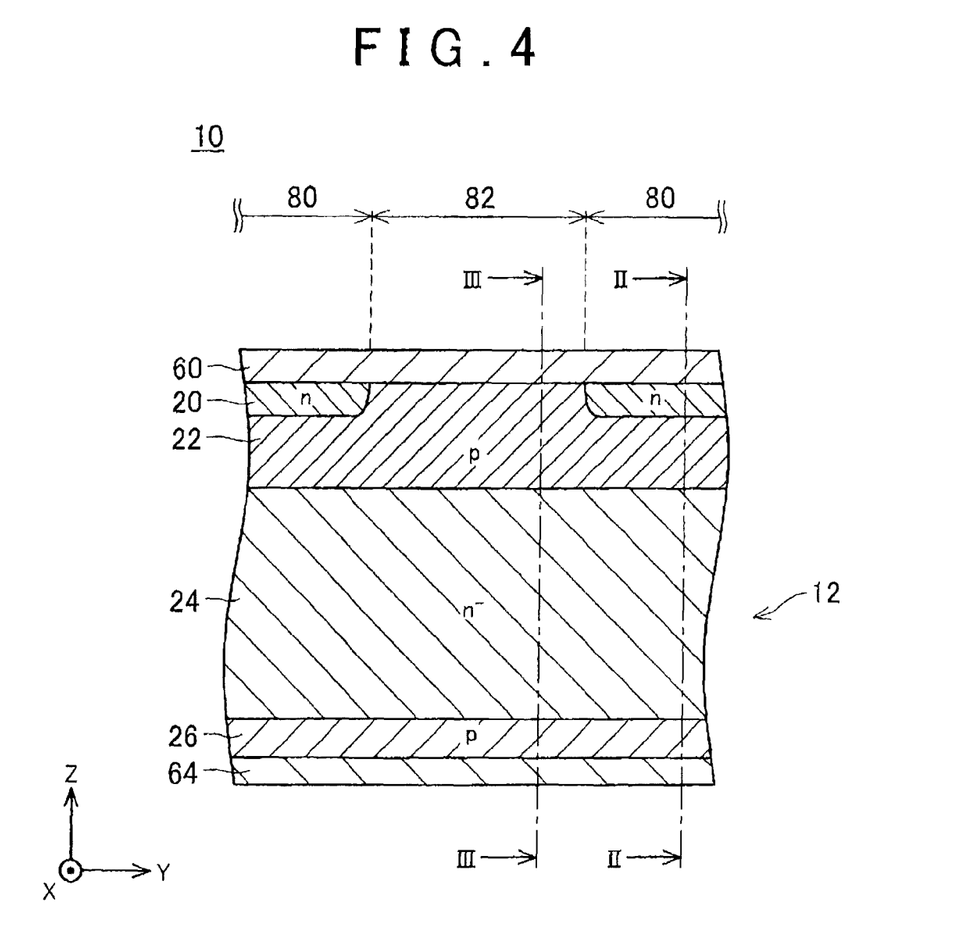
FIG. 4 is a sectional view taken along a YZ plane of the IGBT at a position where a trench is not formed (i.e., a sectional view taken along line IV-IV in FIGS. 2 and 3)

As shown in FIG. 1, an n-type emitter region 20 and a p-type body region 22 are formed in an area exposed on the upper surface of the semiconductor substrate 12. As shown in FIG. 4, the emitter region 20 is formed only in a shallow area near the upper surface of the semiconductor substrate 12. The body region 22 is formed to the side of and below the emitter region 20. The body region 22 is exposed on the upper surface of the semiconductor substrate 12 in an area where the emitter region 20 is not formed. As shown in FIG. 1, an area where the emitter region 20 is exposed and an area where the body region 22 is exposed are formed long in the X-direction on the upper surface of the semiconductor substrate 12. Also, the emitter region 20 and the body region 22 are formed on the upper surface of the semiconductor substrate 12 such that the area where the emitter region 20 is exposed and the area where the body region 22 is exposed appear alternating repeatedly in the Y-direction. Hereinafter, when viewed perpendicular to the upper surface of the semiconductor substrate 12, the area where the emitter region 20 is exposed will be referred to as an emitter exposed area 80, and the area where the body region 22 is exposed will be referred to as a body exposed area 82.

An n-type drift region 24 is formed below the p-type body region 22. This drift region 24 is separated from the emitter region 20 by the body region 22. An n-type impurity concentration of the drift region 24 is relatively low.

A p-type collector region 26 is formed below the drift region 24. The collector region 26 is formed exposed on substantially the entire region of a lower surface of the semiconductor substrate 12.

As shown in FIG. 1, a plurality of trenches 38 are formed in the upper surface of the semiconductor substrate 12. The trenches 38 are formed in the Y-direction. The trenches 38 are formed from the upper surface of the semiconductor substrate 12 to a depth that reaches the drift region 24. A shield electrode 30, a gate electrode 32, and an insulating film 36 are formed in each of the trenches 38. Hereinafter, the trenches 38 may also be referred to in the singular to facilitate understanding.

Figure 2:
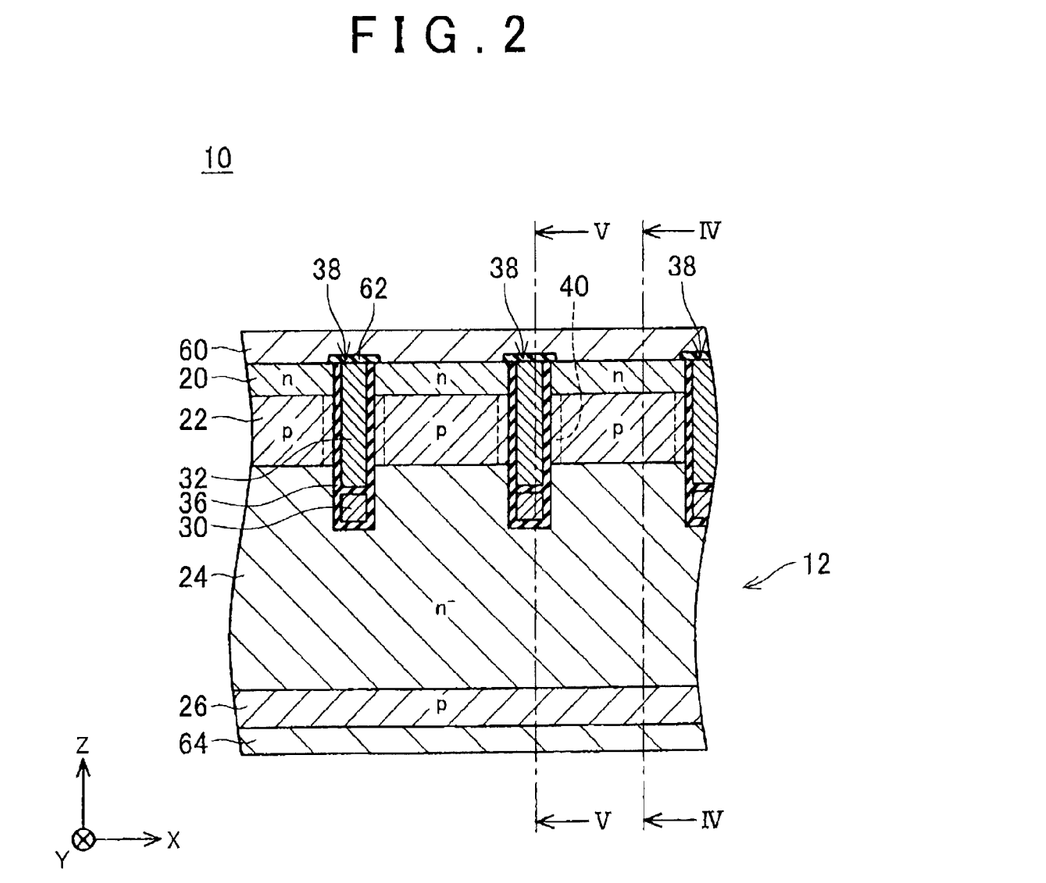
FIG. 2 is a sectional view taken along an XZ plane of the IGBT in an emitter exposed area (i.e., a sectional view taken along line II-II in FIGS. 4 and 5)
Figure 3:
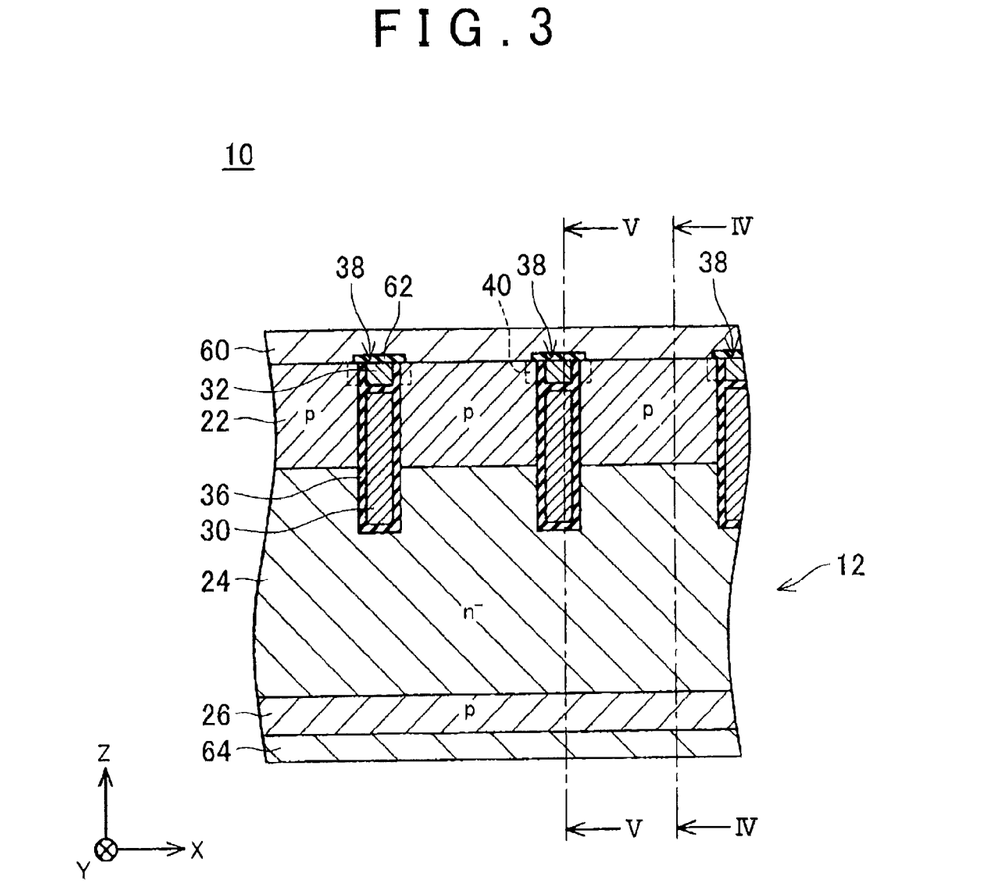
FIG. 3 is a sectional view taken along the XZ plane of the IGBT in a body exposed area (i.e., a sectional view taken along line III-III in FIGS. 4 and 5)
Figure 5:
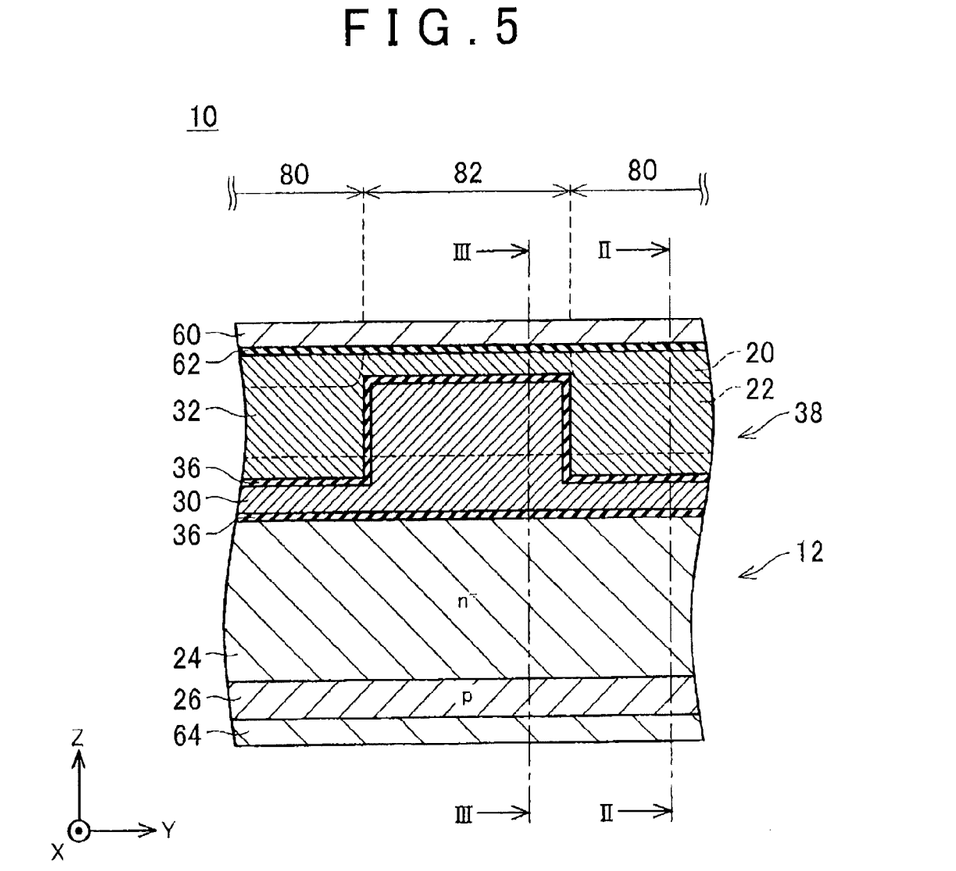
FIG. 5 is a sectional view taken along the YZ plane of the IGBT at a position where a trench is formed (i.e., a sectional view taken along line V-V in FIGS. 2 and 3), showing, by a broken line, an image of when an emitter region and a body region are projected in an X direction on that cross section.

The shield electrode 30 is formed near a bottom portion of the trenches 38. The shield electrode 30 is insulated from the semiconductor substrate 12 by the insulating film 36. As shown in FIGS. 2 and 5, the shield electrode 30 is formed to a depth of the drift region 24 (i.e., below a lower end of the body region 22), in the trenches 38 formed in the emitter exposed area 80. Also, as shown in FIGS. 3 and 5, the shield electrode 30 is formed from the depth of the body region 22 to the depth of the drift region 24, in the trenches 38 formed in the body exposed area 82. That is, the shield electrode 30 is formed thicker in the body exposed area 82 than it is in the emitter exposed area 80.

The gate electrode 32 is formed above the shield electrode 30. The gate electrode 32 is insulated from the shield electrode 30 by the insulating film 36. Also, the gate electrode 32 is insulated from the semiconductor substrate 12 by the insulating film 36. As shown in FIGS. 2 and 5, the gate electrode 32 is formed from the upper surface of the semiconductor substrate 12 to the depth of the drift region 24 below the lower end of the body region 22), in the trenches 38 formed in the emitter exposed area 80. Also, as shown in FIGS. 3 and 5, the gate electrode 32 is formed to the depth of the body region 22 (i.e., above the lower end of the body region 22), in the trenches 38 formed in the body exposed area 82. An interlayer insulating film 62 is formed on an upper surface of the gate electrode 32.

An emitter electrode 60 is formed on the upper surface of the semiconductor substrate 12. This emitter electrode 60 is ohmically connected to the emitter region 20 and the body region 22. Also, the emitter electrode 60 is insulated from the gate electrode 32 by the interlayer insulating film 62.

The collector electrode 64 is formed on the lower surface of the semiconductor substrate 12. The collector electrode 64 is ohmically connected to the collector region 26.

Figure 6:
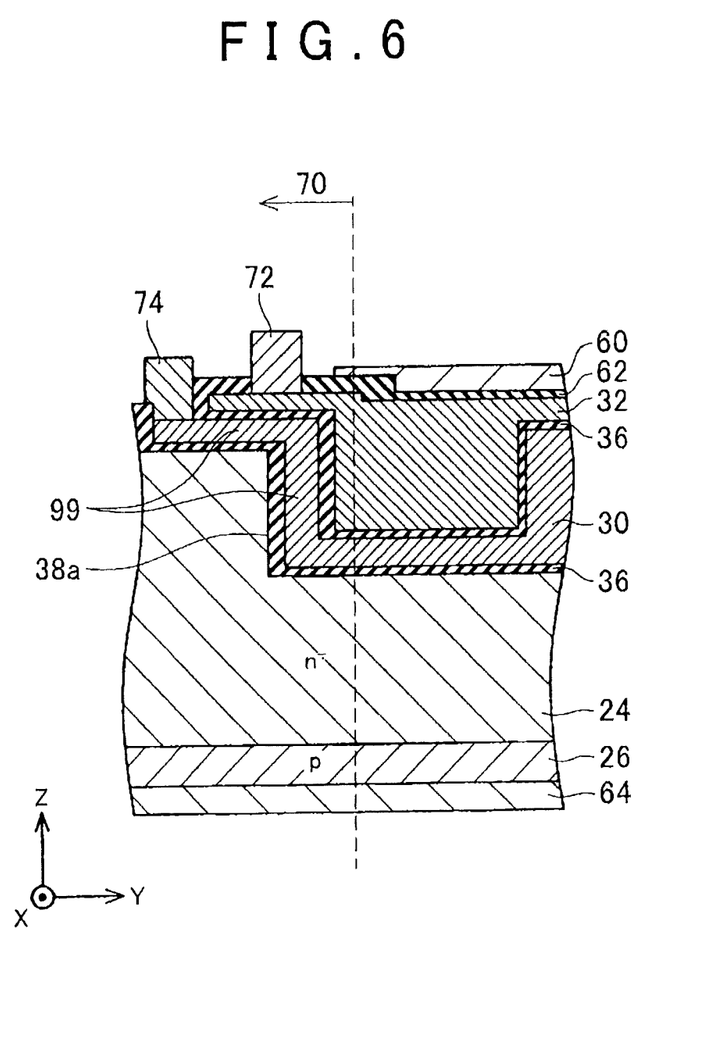
FIG. 6 is a sectional view taken along the YZ plane near an end portion of a trench of the IGBT.

FIG. 6 is a view of the sectional structure near an end portion 38a of the trench 38 in the Y-direction. As shown in the drawing, the trench 38 is formed to an inactive region 70. This inactive region 70 is a region where the emitter region 20 and the body region 22 are not formed (i.e., where the drift region 24 is exposed on the upper surface of the semiconductor substrate 12). A gate wiring 72 and an emitter wiring 74 are formed in the inactive region 70. The gate electrode 32 is connected to the gate wiring 72. As a result, a desired voltage is able to be applied to the gate electrode 32. The shield electrode 30 is connected to the emitter wiring 74. The emitter wiring 74 is connected to the emitter electrode 60 at a position that is not shown. That is, the shield electrode 30 is connected to the emitter electrode 60.

Next, operation of the IGBT 10 will be described. When a predetermined voltage is applied to the gate electrode 32, electrons present in the body region 22 are pulled toward the region near the gate electrode 32, of the body region 22. As a result, an n-type-inverted inverted region 40 in the body region 22 is formed in the body region 22, as shown in FIGS. 2 and 3. As shown in FIG. 2, a current path (i.e., a channel) that connects the emitter region 20 to the drift region 24 is formed by the inverted region 40, in the emitter exposed area 80. As a result, the IGBT 10 turns on. On the other hand, in the body exposed area 82, the inverted region 40 is formed only near the upper surface of the semiconductor substrate 12, as shown in FIG. 3. That is, in the body exposed area 82, the inverted region 40 does not reach the lower end of the body region 22. Therefore, the inverted region 40 in the body exposed area 82 does not form a channel. Even if no channel is formed in the body exposed area 82 in this way, it does not pose any particular problem. That is, with a related IGBT, a channel (i.e., an inverted region that reaches the lower end of the body region) is formed in the body region in the body exposed area, but because the body exposed area is separated from the emitter region, almost no current flows through the channel in the body exposed area. Therefore, it is not particularly problematic if a channel is not formed in the body region 22 in the body exposed area 82, as in the case with the IGBT 10 of the first example embodiment. That is, the IGBT 10 of the first example embodiment has similar conduction characteristics as the related IGBT. In this way, the gate electrode 32 in the body exposed area 82 does not function as an electrode that forms a channel. Instead, the gate electrode 32 in the body exposed area 82 functions as wiring to connect the gate electrodes 32 in the emitter exposed area 80 together.

Also, typically, if a gate electrode has a higher capacitance than an emitter electrode and a collector electrode, it takes time to charge and discharge electricity to and from the gate electrode, so the switching speed decreases. Therefore, it is preferable that this kind of capacitance be small.

The body region is electrically connected to the emitter electrode, so if the area of the region where the gate electrode and the body region face each other via the insulated film is large, the capacitance between the gate electrode and the emitter electrode will be large. In the IGBT 10 of the first example embodiment, the gate electrode 32 in the body exposed area 82 is formed only in a shallow area near the upper surface of the semiconductor substrate 12. As a result, the area of the region where the gate electrode 32 and the body region 22 face each other via the insulating film 36 is reduced. Therefore, with this IGBT 10, the capacitance between the gate electrode 32 and the emitter electrode 60 is small.

Also, in the IGBT 10 of the first example embodiment, the shield electrode 30 is formed in the entire region below the gate electrode 32. Providing the shield electrode 30 enables the capacitance between the gate electrode 32 and the drift region 24 (i.e., the collector electrode 64) to be reduced. In particular, the shield electrode 30 is electrically connected to the emitter electrode 60, so the capacitance between the gate electrode 32 and the collector electrode 64 is able to be more effectively reduced in the IGBT 10. Also, making the shield electrode 30 thick in the body exposed area 82 enables the shallow gate electrode 32 to be formed easily.

Also, in the IGBT 10, the depth of the low end of the shield electrode 30 is substantially constant from the emitter exposed area 80 through the body exposed area 82. Therefore, when the IGBT 10 is off, the electrical field distribution in the drift region 24 is not easily disturbed due to the shield electrode 30. As a result, high voltage resistance of the IGBT 10 is improved.

Figure 7:
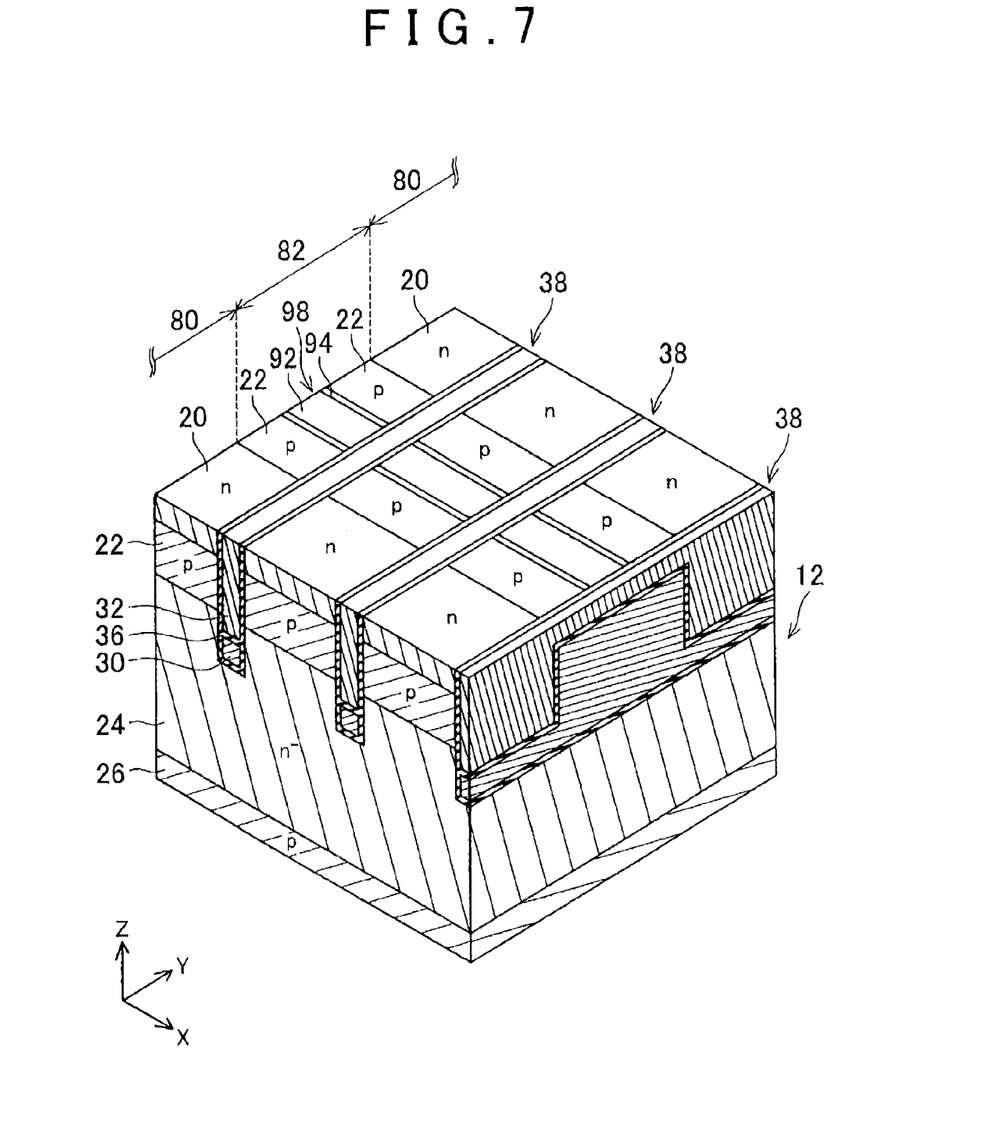
FIG. 7 is a partial sectional view of an upper surface and a cross section of an IGBT according to a second example embodiment of the invention.

An IGBT according to a second example embodiment of the invention that is shown in FIG. 7 differs from the IGBT 10 according to the first example embodiment, in that it is provided with a trench wiring 92. The other structure of the IGBT of the second example embodiment is the same as that of the IGBT of the first example embodiment. In FIG. 7, the same reference characters used in the first example embodiment are used to denote structural elements corresponding to the IGBT 10 of the first example embodiment.

Figure 8:
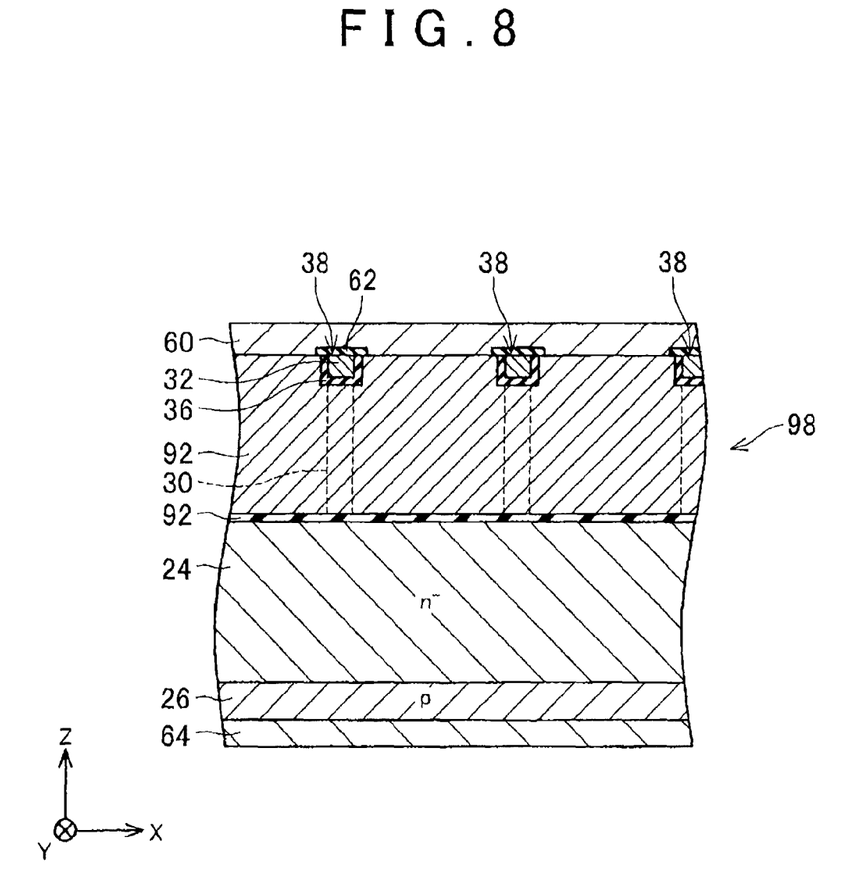
FIG. 8 is a sectional view along a trench of the IGBT according to the second example embodiment of the invention.

As shown in FIG. 7, a trench 98 formed in the X-direction is formed in the upper surface of the semiconductor substrate 12 in the body exposed area 82. An inside surface of the trench 98 is covered by an insulating film 94. The trench wiring 92 is formed inside of the trench 98. The trench wiring 92 is insulated from the semiconductor substrate 12 by the insulating film 94. As shown in FIG. 8, the trench wiring 92 is connected to the shield electrode 30 at portions where the trench 98 and the trenches 38 intersect. Also, the trench wiring 92 is insulated from the gate electrode 32 by the insulating film 36. The emitter electrode 60 is formed on the trench wiring 92. Therefore, the shield electrode 30 and the emitter electrode 60 are connected via the trench wiring 92.

Figure 9:
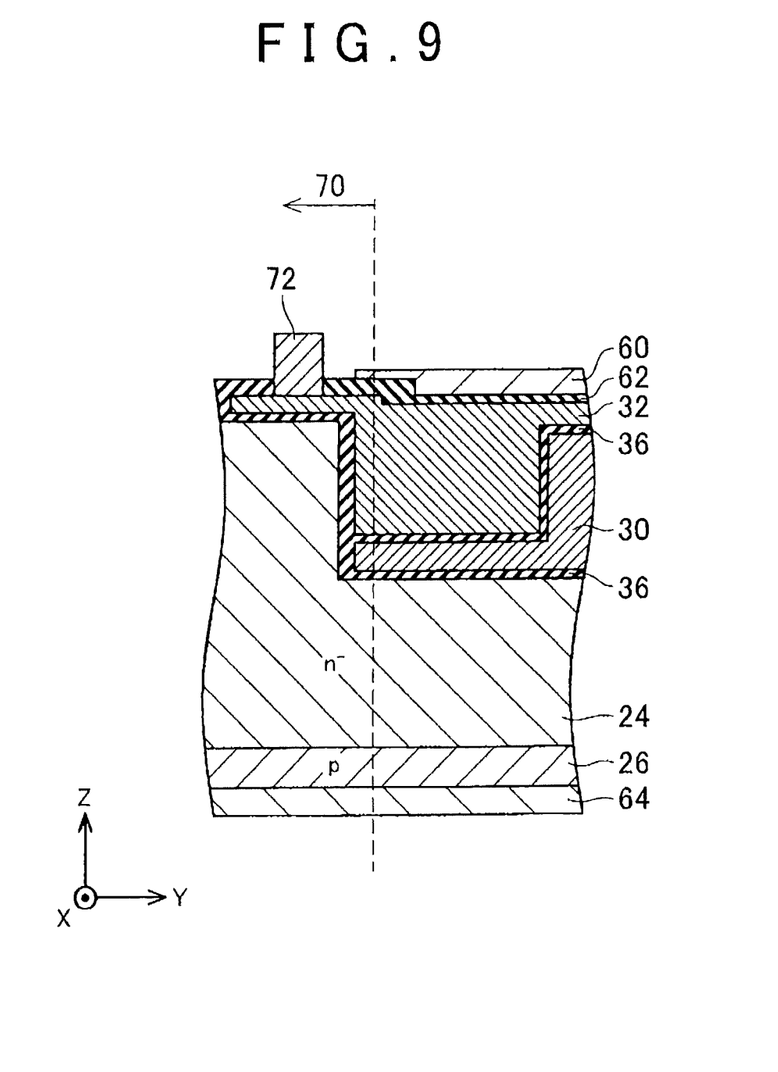
FIG. 9 is a sectional view taken along the YZ plane near an end portion of the trench of the IGBT according to the second example embodiment of the invention.

As described above, the shield electrode 30 and the emitter electrode 60 are connected via the trench wiring 92, so in the IGBT according to the second example embodiment, a wiring portion for connecting the shield electrode 30 to the emitter electrode 60 (i.e., the portion denoted by reference character 99 in FIG. 6) is not formed in the inactive region 70, as shown in FIG. 9. As a result, the capacitance between the gate electrode 32 and the shield electrode 30 is reduced. Also, the wiring portion 99 and the emitter wiring 74 (see FIG. 6) are able to be reduced, so the IGBT can be even smaller.

Figure 10:
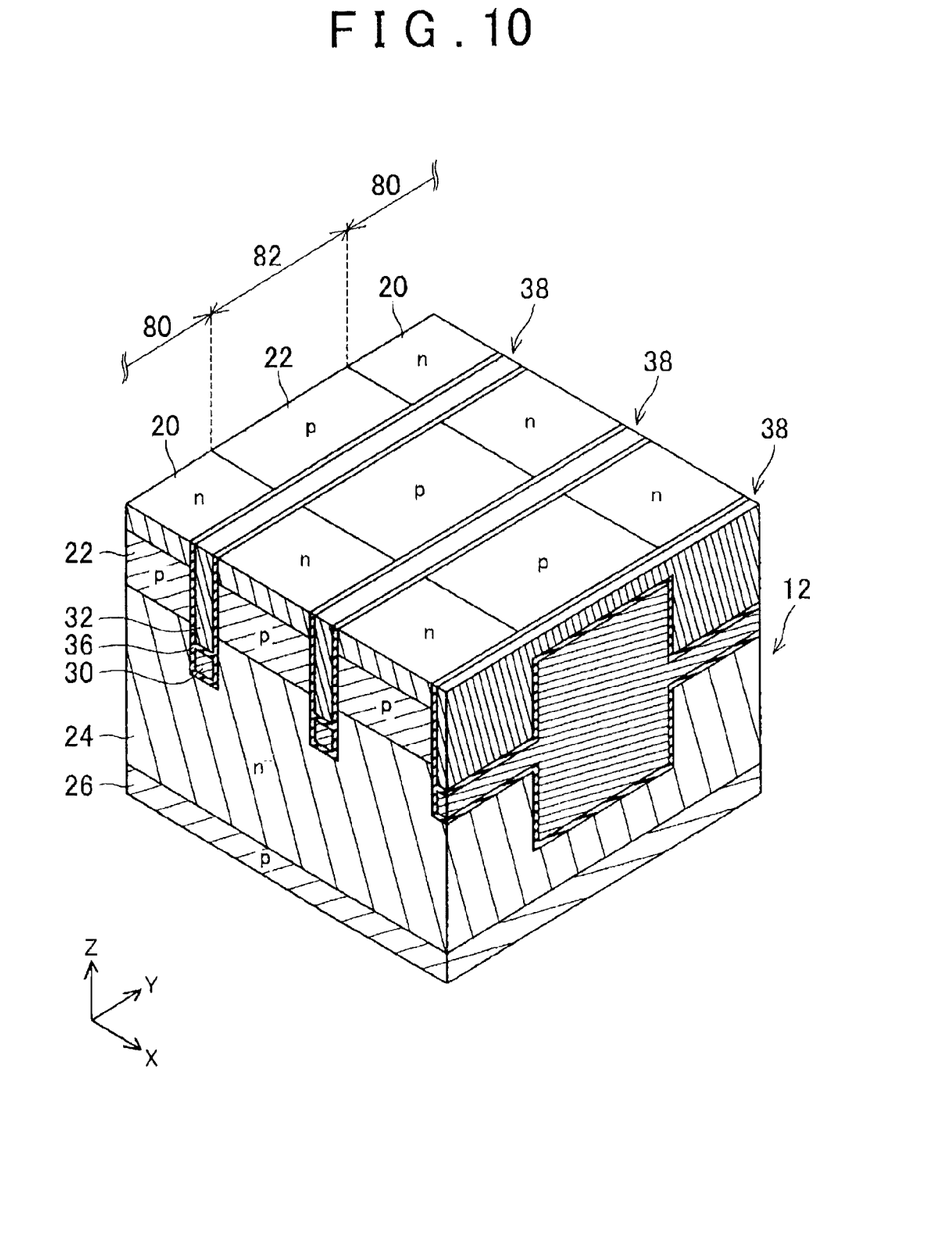
FIG. 10 is a partial perspective view of an upper surface and a cross section of an IGBT according to a first modified example of the first example embodiment.
Figure 11:
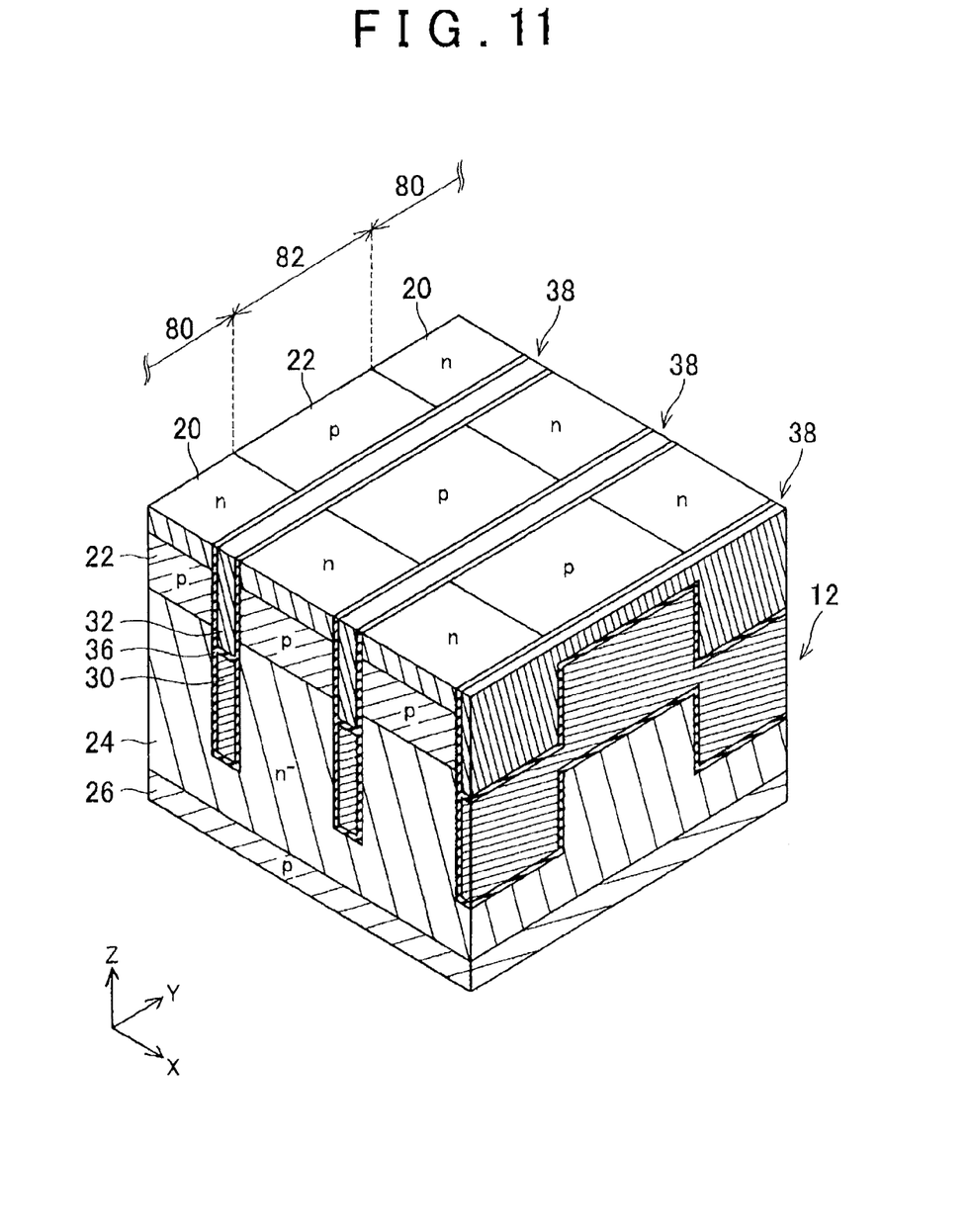
FIG. 11 is a partial perspective view of an upper surface and a cross section of an IGBT according to a second modified example of the first example embodiment.

Also, in the example embodiment described above, the position of the lower end of the shield electrode 30 is at a substantially constant depth, but the position of the lower end of the shield electrode 30 may also be changed, as shown in FIGS. 10 and 11.

Figure 12:
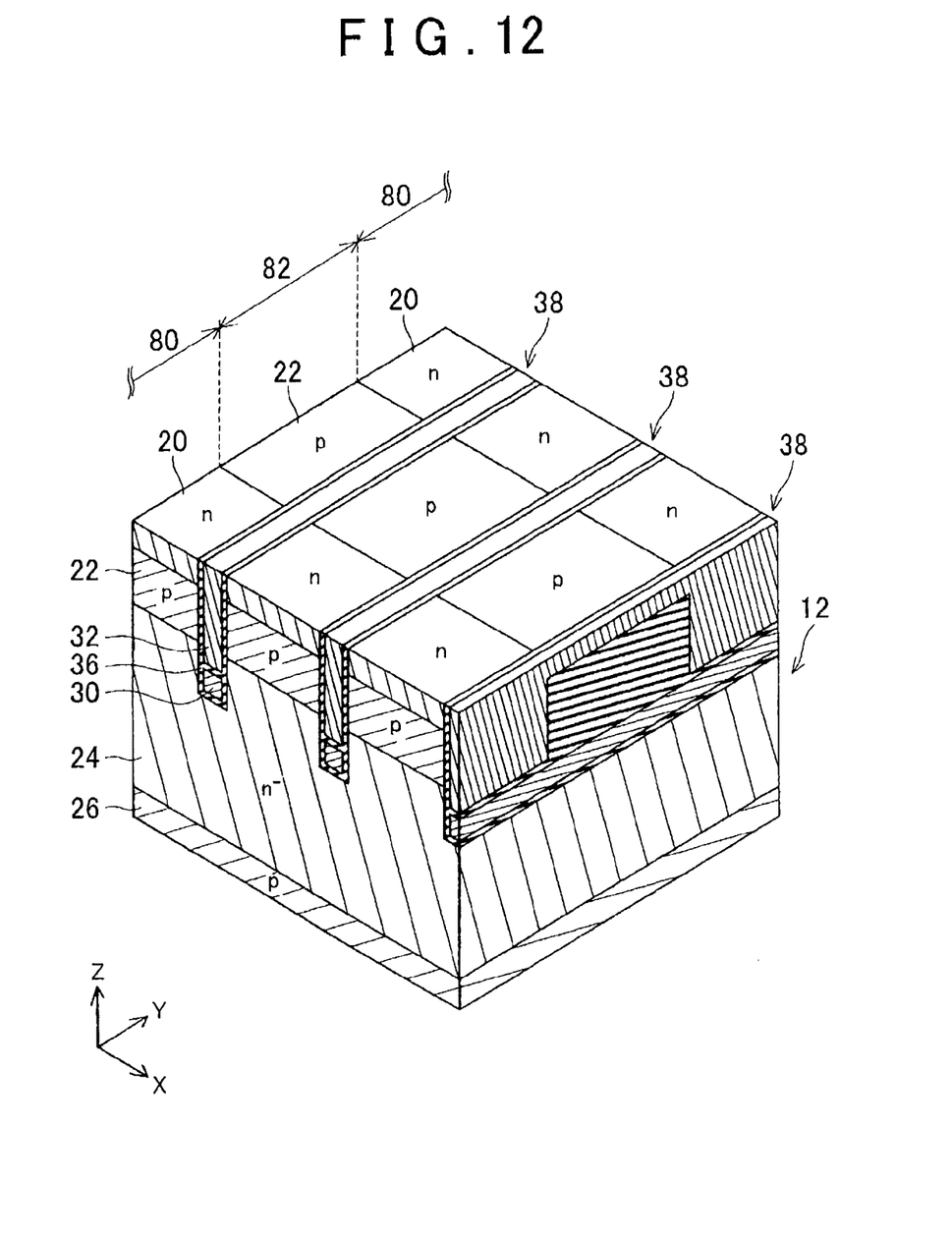
FIG. 12 is a partial perspective view of an upper surface and a cross section of an IGBT according to a third modified example of the first example embodiment.

Also, in the example embodiment described above, the thick shield electrode 30 formed below the shallow gate electrode 32 in the body exposed area 82. However, the insulating film 36 may also be formed thick below the gate electrode 32, as shown in FIG. 12. Also, in the example embodiment described above, the shield electrode 30 is formed in the entire region below the gate electrode 32, but the shield electrode 30 may also be partially formed, or the shield electrode 30 may not be formed at all.

Also, in the example embodiment described above, the gate electrode 32 is formed deep over the substantially the entire region in the trench 38 in the emitter exposed area 80, but the gate electrode 32 may alternatively be formed shallow, as it is in the body exposed area 82, at a portion in the trench 38 in the emitter exposed area 80. Also, in the example embodiment described above, the shallow gate electrode 32 is formed along substantially the entire region in the trench 38 in the body exposed area 82, but the gate electrode 32 may also be formed deep, as it is in the emitter exposed area 80, at a portion in the trench 38 in the body exposed area 82.

In the example embodiment described above, an example in which the technology described in this specification is applied to an IGBT is described. In this case, the emitter region 20 corresponds to a first region, the body region 22 corresponds to a second region, and the drift region 24 corresponds to a third region. However, this technology may also be applied to a MOSFET. When applied to an nMOSFET, a layer that contains a high concentration of n-type impurities may be formed instead of the collector region 26 in the example embodiments described above. Also, this technology may also be applied to a pMOSFET.

While the invention has been described with reference to example embodiments thereof, it is to be understood that the invention is not limited to the described embodiments or constructions. To the contrary, the invention is intended to cover various modifications and equivalent arrangements. In addition, while the various elements of the example embodiments are shown in various combinations and configurations, other combinations and configurations, including more, less or only a single element, are also within the scope of the invention.

What is claimed is:

1. A switching element comprising:
   a semiconductor substrate having a first region of a first conduction type that is exposed on an upper surface of the semiconductor substrate, a second region of a second conduction type that is exposed on the upper surface of the semiconductor substrate and extends to below the first region, and a third region of the first conduction type that is formed below the second region and is separated from the first region by the second region;

an upper electrode that is formed on the upper surface of the semiconductor substrate and is electrically connected to the first region and the second region;

a trench that is formed in the upper surface of the semiconductor substrate and is formed extending between a region where the first region is exposed and a region where the second region is exposed; and a gate electrode that includes a first portion that is formed in the trench, and extends from a depth of the first region to a depth of the third region at at least a portion in the trench formed in an area where the first region is exposed when the upper surface of the semiconductor substrate is viewed from above, and a second portion that is formed in the trench, and extends from a depth of the first region to a depth of the second region, and does not reach the depth of the third region, at at least a portion in the trench formed in an area where the second region is exposed when the upper surface of the semiconductor substrate is viewed from above, the gate electrode being insulated from the semiconductor substrate by an insulating film.

2. The switching element according to claim 1, further comprising a shield electrode that is formed below the first portion, and that is insulated from the gate electrode and the semiconductor substrate by an insulating film.

3. The switching element according to claim 2, wherein the shield electrode is formed to below the second portion.

4. The switching element according to claim 3, wherein the shield electrode below the second portion extends from the depth of the second region to the depth of the third region.

5. The switching element according to claim 2, wherein the shield electrode is electrically connected to the upper electrode.

* * * * *